United States Patent [19]
Block et al.

[11] Patent Number: 6,162,590
[45] Date of Patent: Dec. 19, 2000

[54] METHOD FOR MAKING AN OPTICAL OR MAGNETO-OPTIC HEAD AND THE RESULTING HEAD

[75] Inventors: Barry Block, Los Altos; Arnold Thornton, San Jose; Walter Daschner, Mountain View, all of Calif.

[73] Assignee: Aerial Imaging Corporation, Milpitas, Calif.

[21] Appl. No.: 09/059,778

[22] Filed: Apr. 13, 1998

Related U.S. Application Data

[63] Continuation-in-part of application No. 08/833,608, Apr. 11, 1997, and a continuation-in-part of application No. 08/857,324, May 16, 1997, Pat. No. 5,998,066.

[51] Int. Cl.$^7$ .................................................. G11B 7/22
[52] U.S. Cl. ...................... 430/321; 430/315; 430/317; 430/318; 430/319
[58] Field of Search ................................... 430/313, 314, 430/315, 316, 317, 318, 319, 321

[56] References Cited

U.S. PATENT DOCUMENTS

| | | | |
|---|---|---|---|
| 4,680,243 | 7/1987 | Shimkunas et al. | 430/5 |
| 4,733,943 | 3/1988 | Suzuki et al. | 350/162.16 |
| 4,866,694 | 9/1989 | Korth | 369/110 |
| 5,078,771 | 1/1992 | Wu | 65/30.11 |

FOREIGN PATENT DOCUMENTS

| | | |
|---|---|---|
| 0475452 A2 | 3/1992 | European Pat. Off. . |

OTHER PUBLICATIONS

Born, et al., "Principles of Optics: Electromagnetic Theory of Propagation Interference and Diffraction of Light", Pergamon Press, 6th Ed., pp. 370–414 (1980).

Cox, et al., "Reappraisal of Arrays of Concentric Annuli as Superresolving Filters", JOSA Letters, vol. 72, No. 9, Sep. 1982, p. 1287–1291.

Hecht, "Optics", Addison–Wesley Publishing Co., 1987, pp. 392–471, 2nd Ed.

Parton, et al., "Applied Electromagnetics", Second Edition, Springer–Verlag New York Inc., pp. 231–250 (1989).

Di Francia, "Nuove Pupille Superrisolventi" Atti. Fond. Giorgio Ronchi 7, 1952, pp. 336–372.

Daschner, "Cost Effective Mass Fabrication of Multilevel Diffractive Optical Elements Using A Single Optical Exposure with a Gray–Scale Mask on High Energy Beam Sensitive Glass", University of California San Diego, Nov./Dec. Journal of American Vacuum Society, 1996, pp. 1–22.

Fowles, "Introduction to Modern Optics", Dover Publications, Ind., 1975, 2nd ed., pp. 128, 129, 140–145.

Meyer–Arendt, "Introduction to Classical and Modern Optics", Prentice–Hall, Inc., 1972, pp. 200–202, 241–242.

"HEBS–Glass Photomask Blanks", Canyon Materials, Inc., CMI Product Information No. 96–01, pp. 1–15.

*Primary Examiner*—John A. McPherson

[57] ABSTRACT

A method for forming a novel head used in magneto-optic or optical disks comprises the steps of forming a diffractive lens on one side of a glass substrate and forming air bearing surface rails on a second side of said glass substrate. The glass substrate is then cut into separate heads. In this way, many magneto-optic or optical heads can be formed simultaneously without incurring the expense of bonding lenses onto a slider. In one embodiment, coils are deposited on the substrate to generate a magnetic field during magneto-optic write operations. In another embodiment, a glass wafer having diffractive lenses formed thereon is bonded to a silicon spacer structure. The glass lenses are used to define a waveguide structure on a transparent layer on the bottom of the silicon spacer

38 Claims, 12 Drawing Sheets

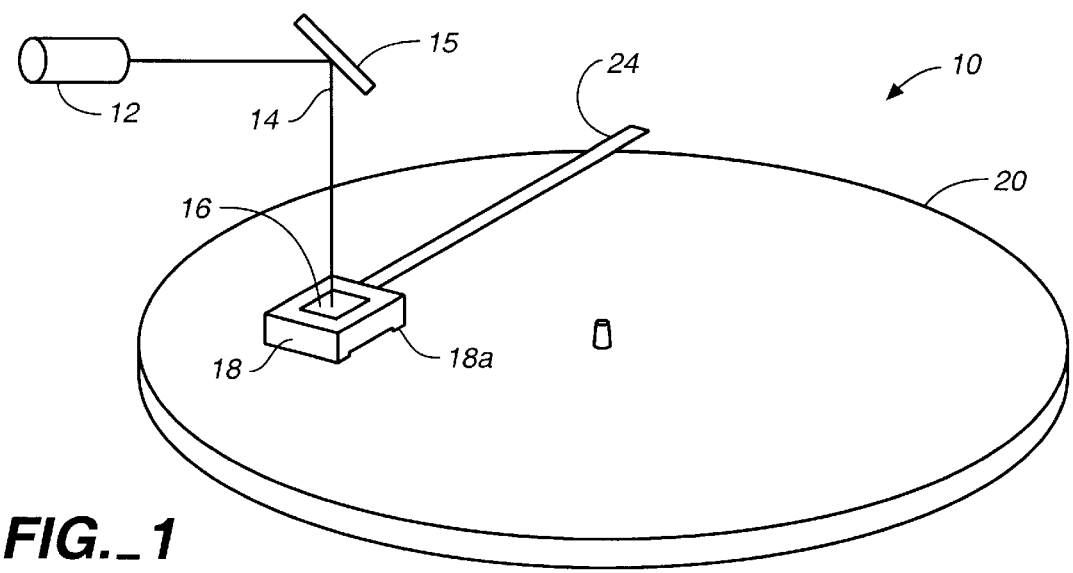
FIG._1
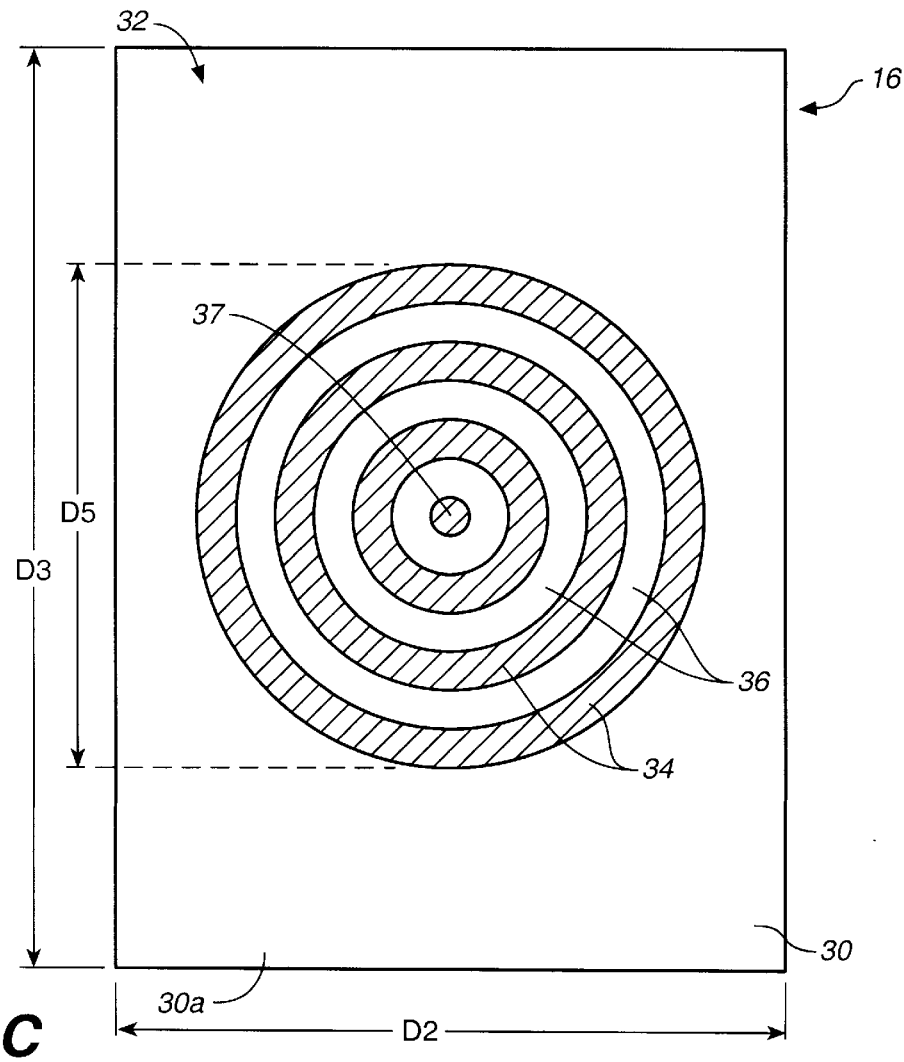
FIG._2C

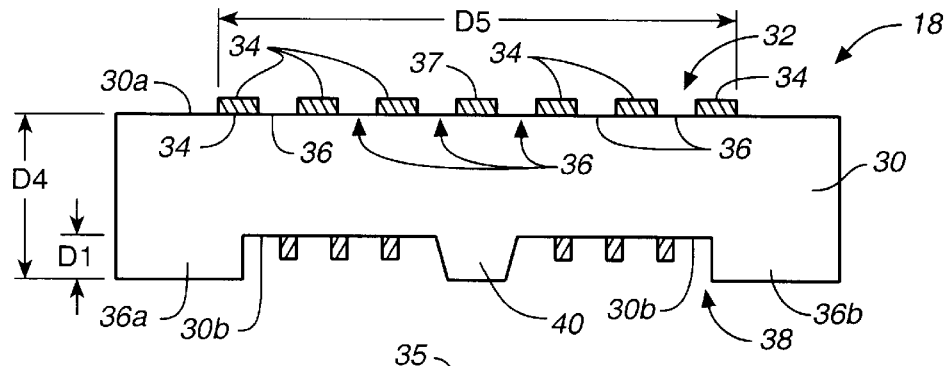
FIG._2A
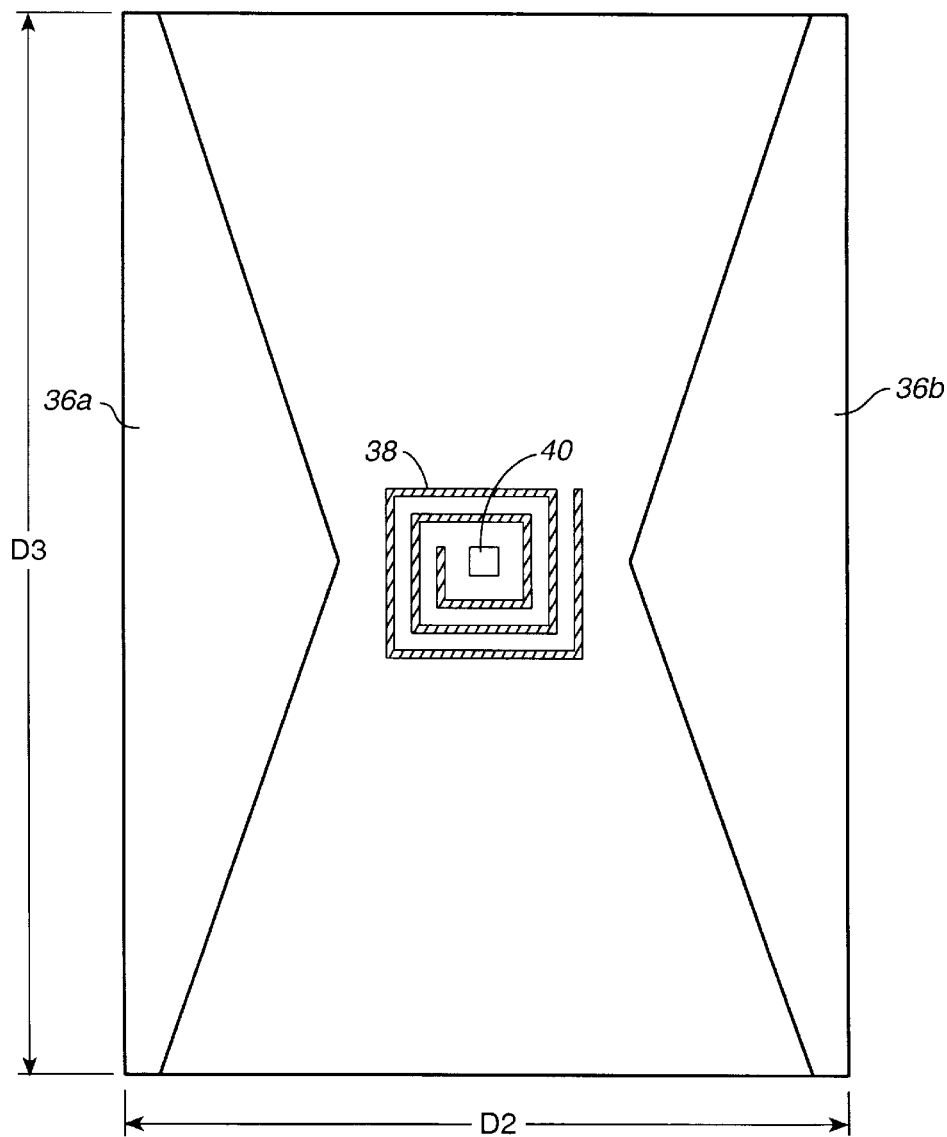
FIG._2B

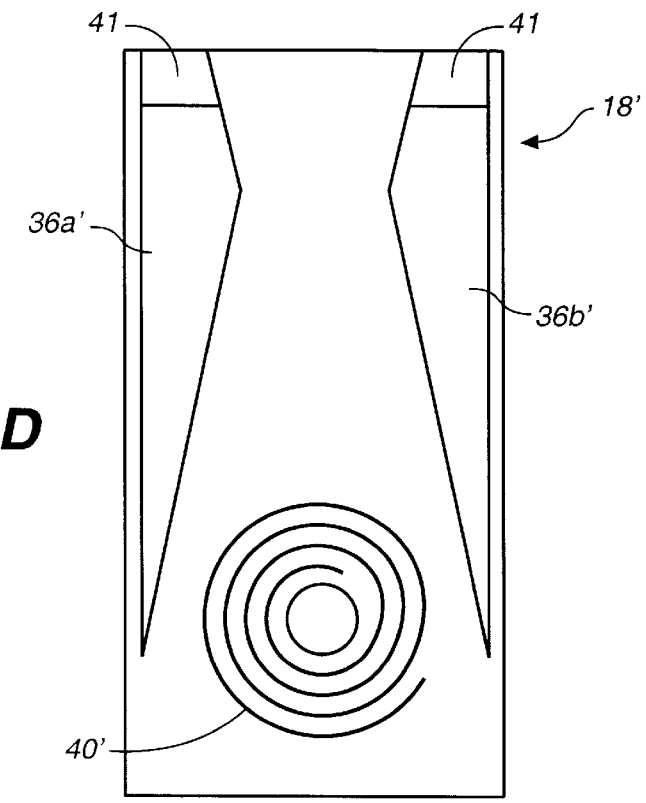
FIG._2D
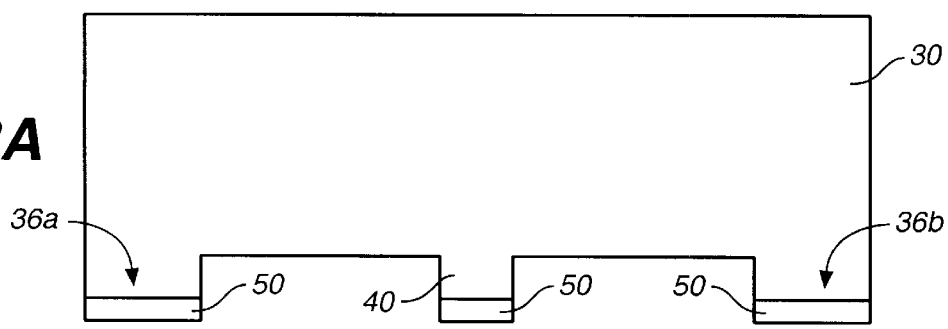
FIG._3A
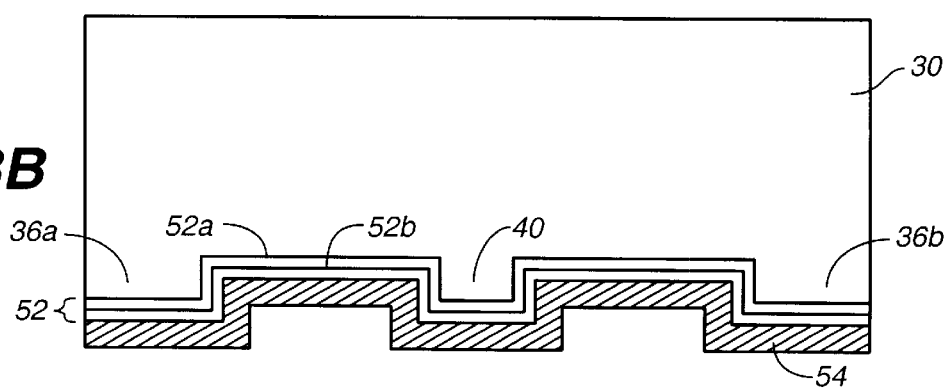
FIG._3B

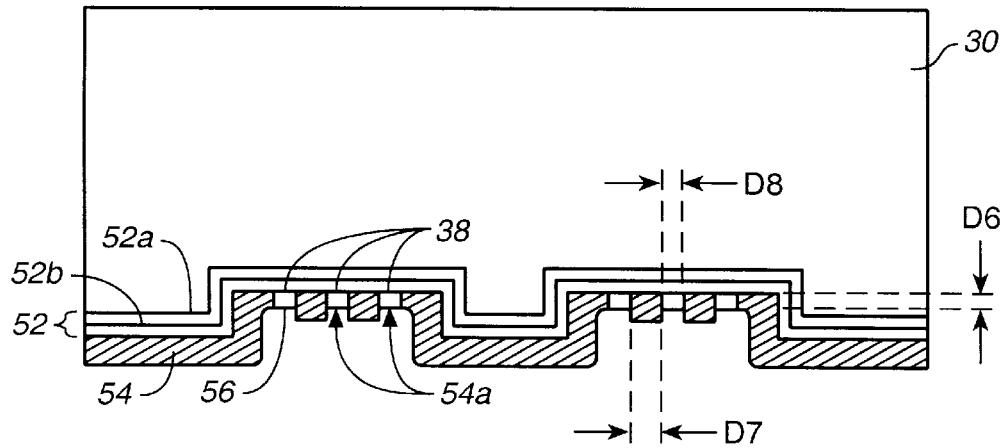
FIG._3C
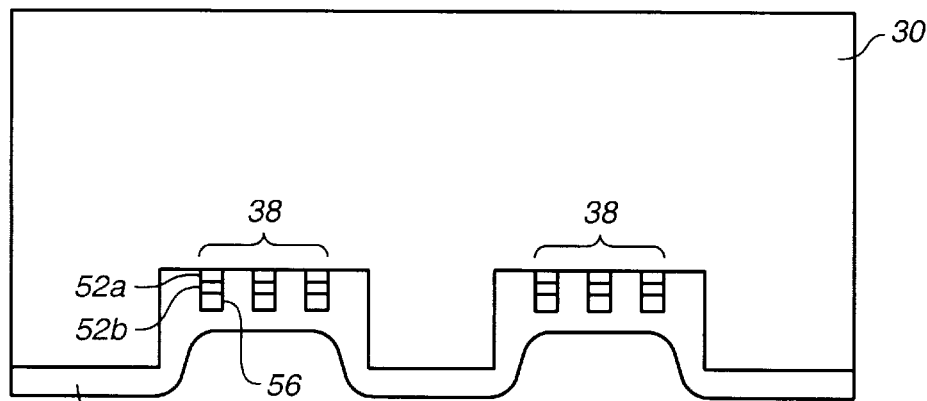
FIG._3D
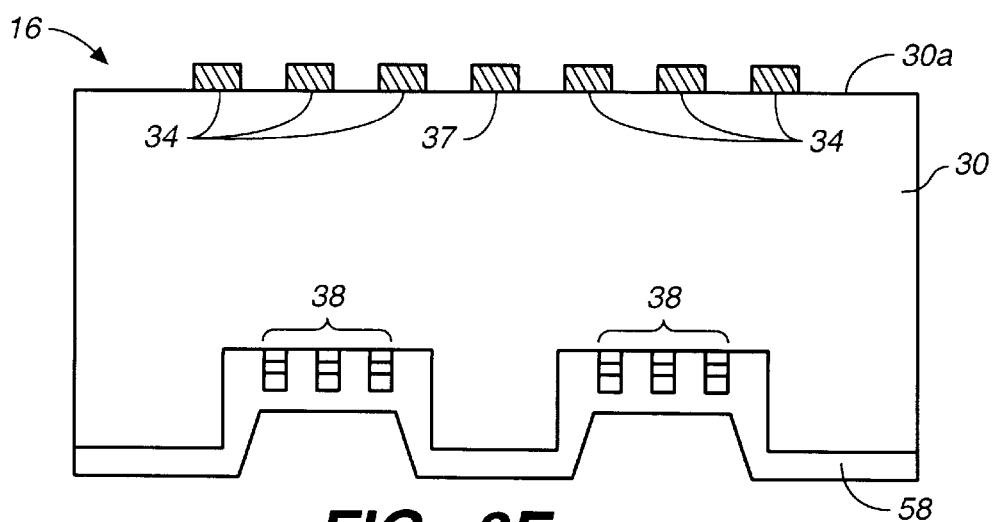
FIG._3E

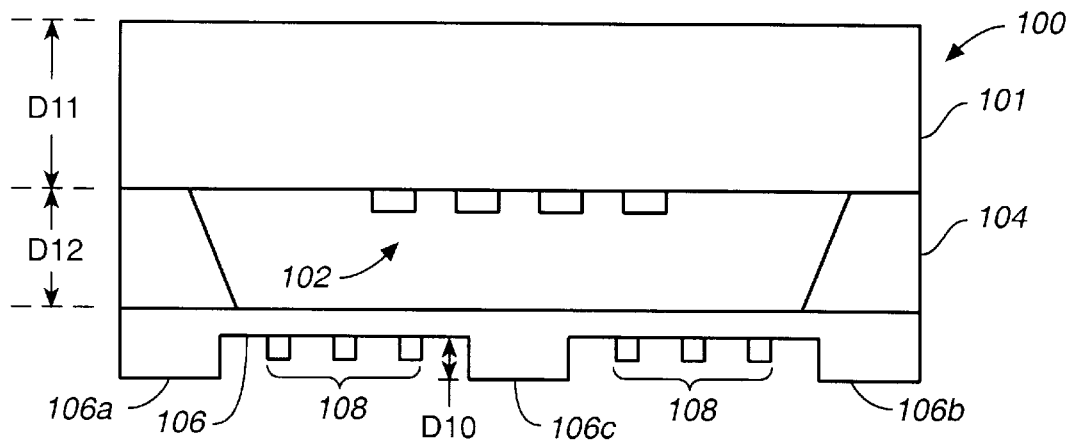
FIG._4
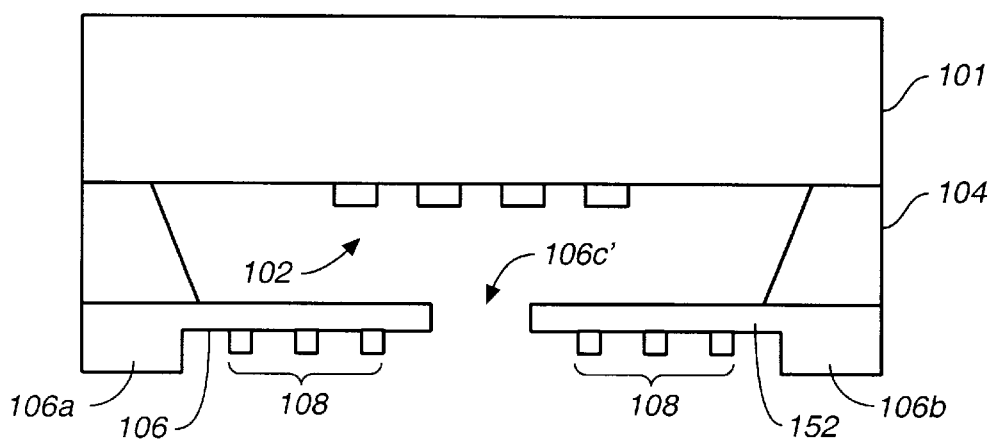
FIG._4'
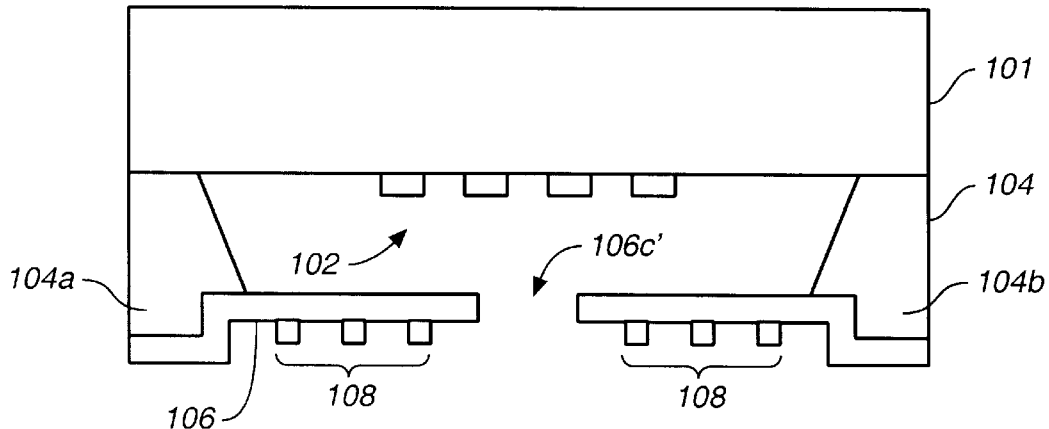
FIG._4"

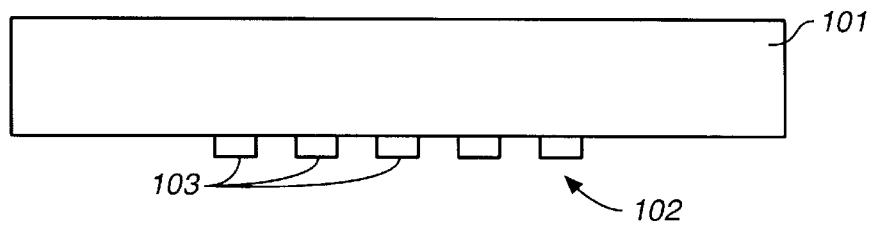
FIG._5A
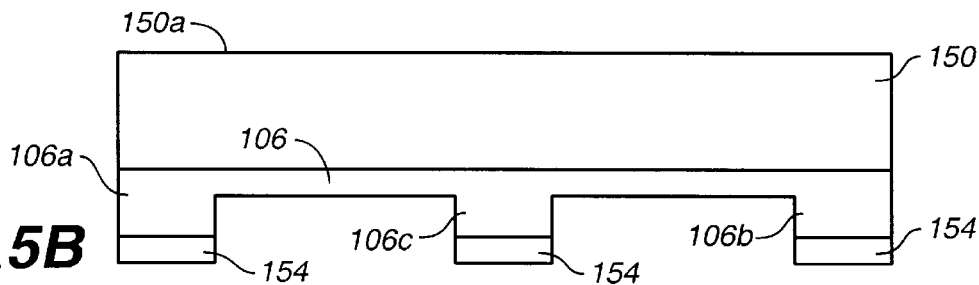
FIG._5B
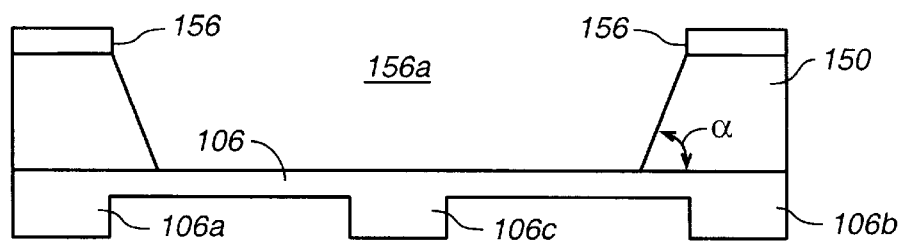
FIG._5C
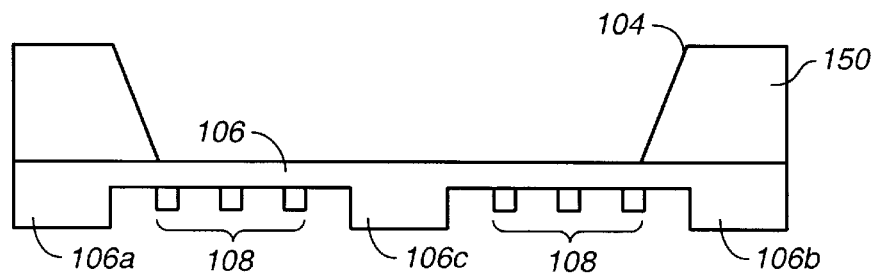
FIG._5D
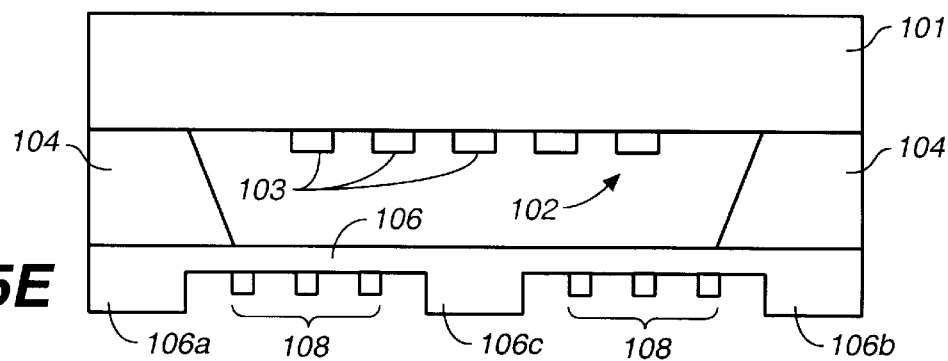
FIG._5E

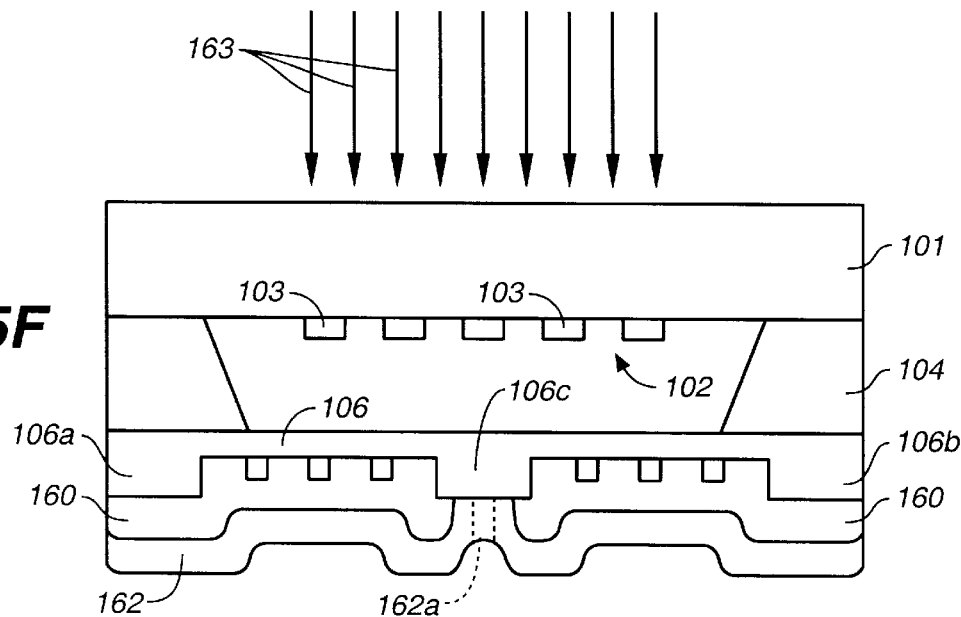
FIG._5F
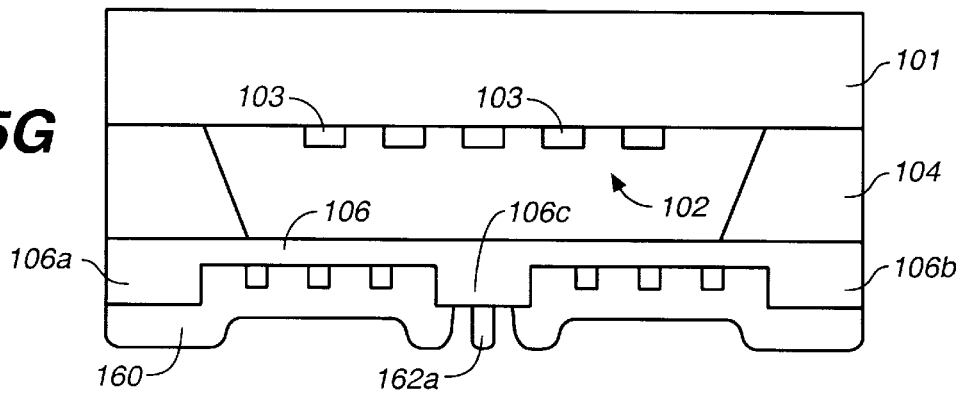
FIG._5G
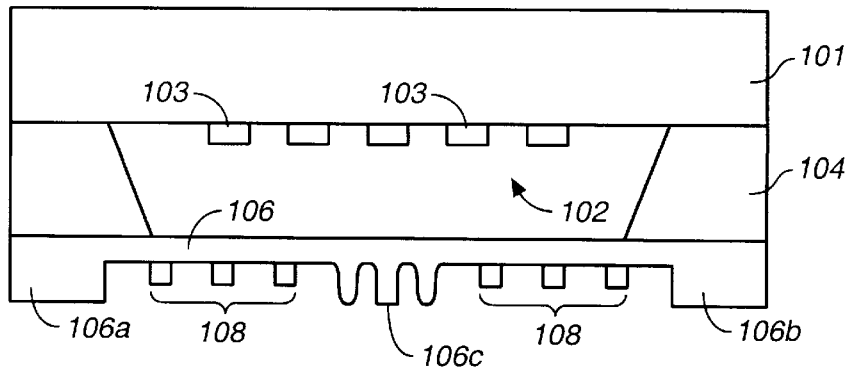
FIG._5H

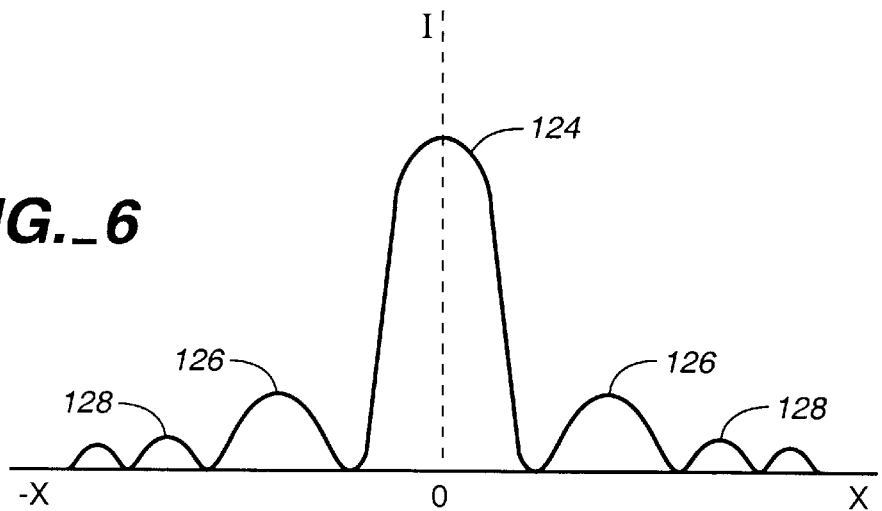
FIG._6
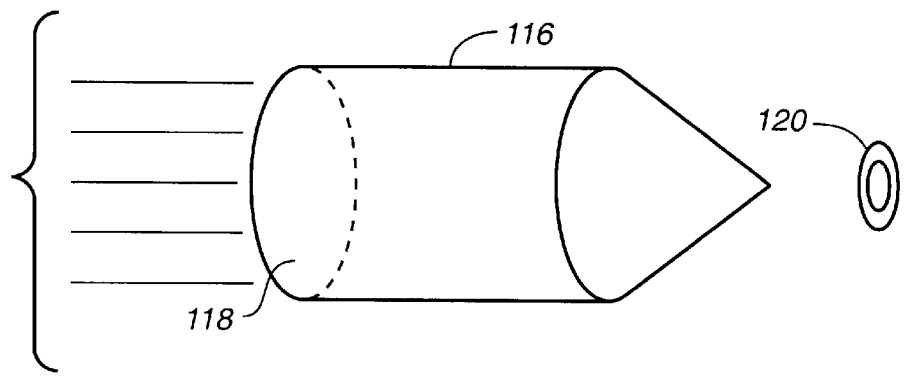
FIG._7
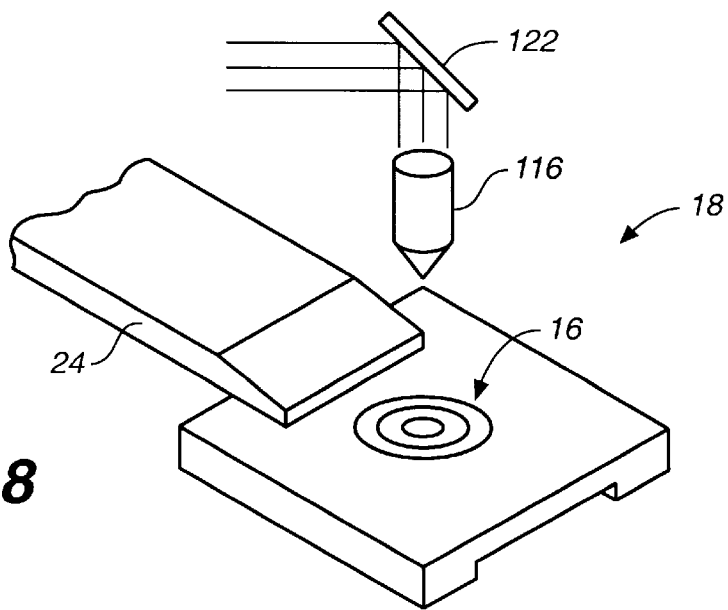
FIG._8

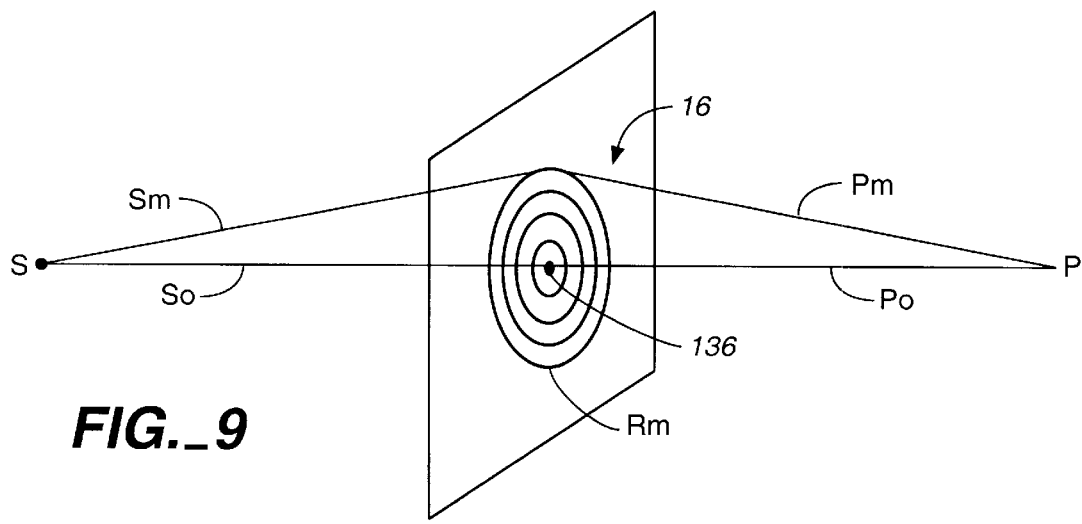
FIG._9
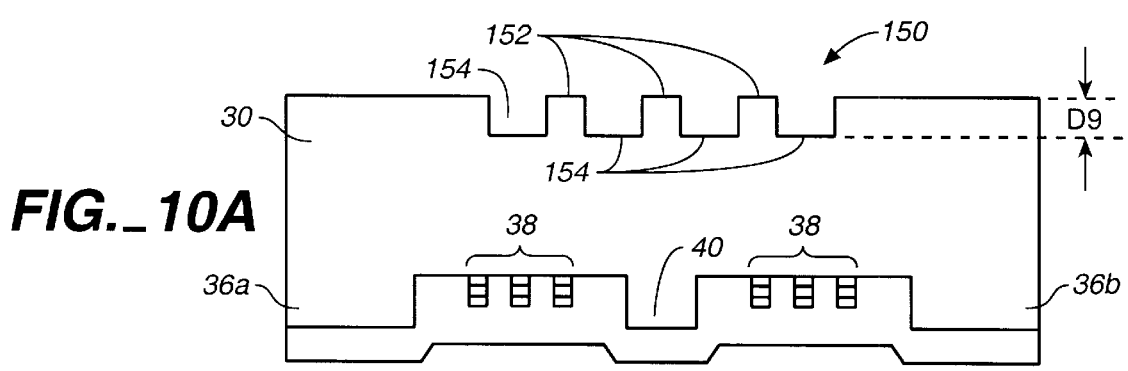
FIG._10A
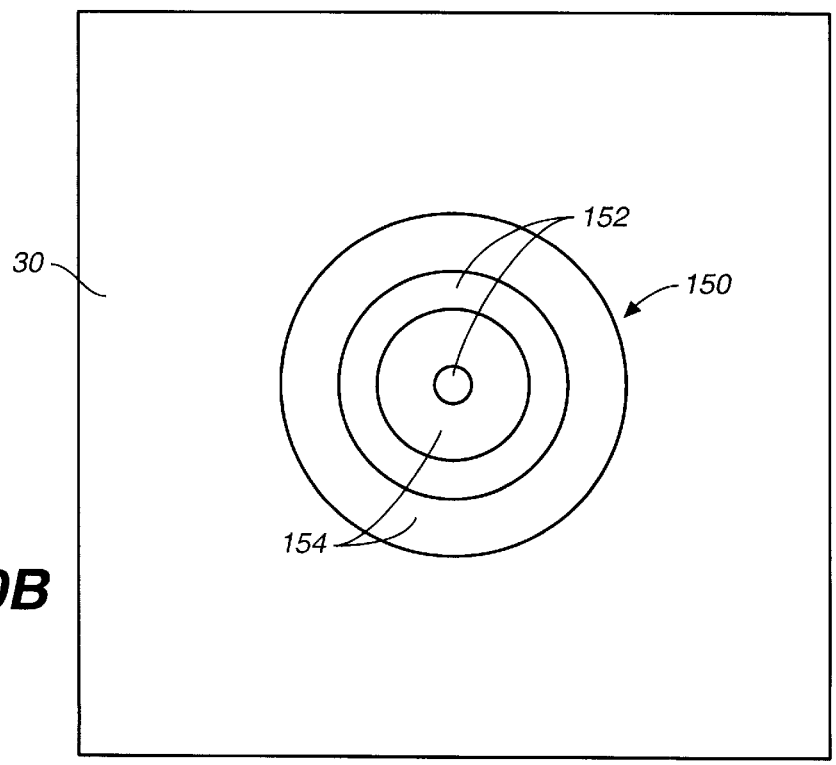
FIG._10B

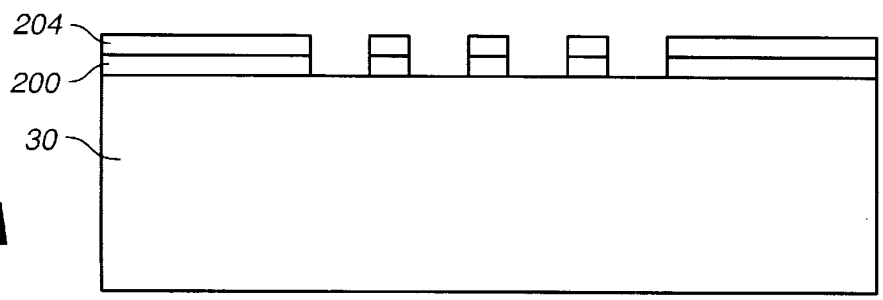
FIG._11A
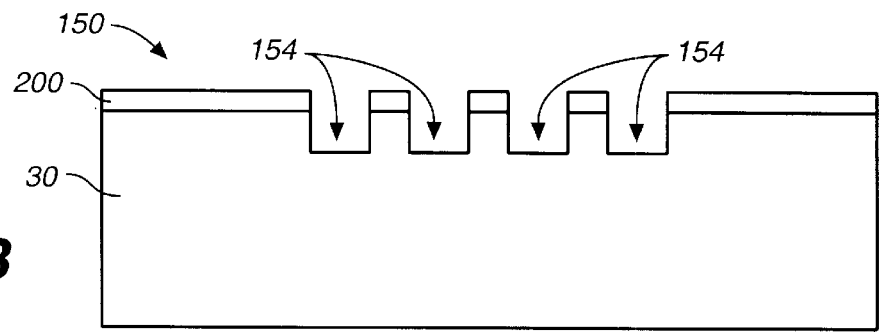
FIG._11B
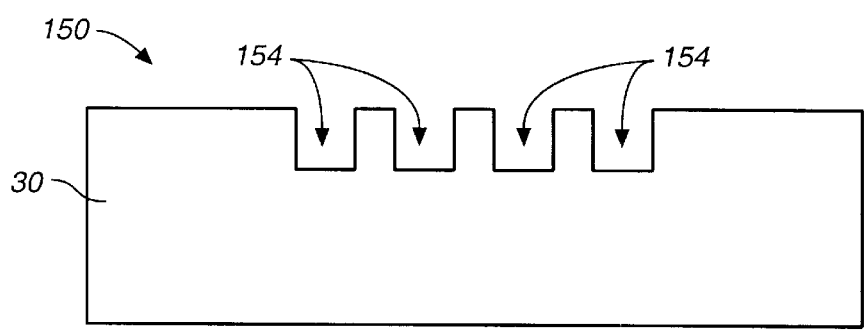
FIG._11C
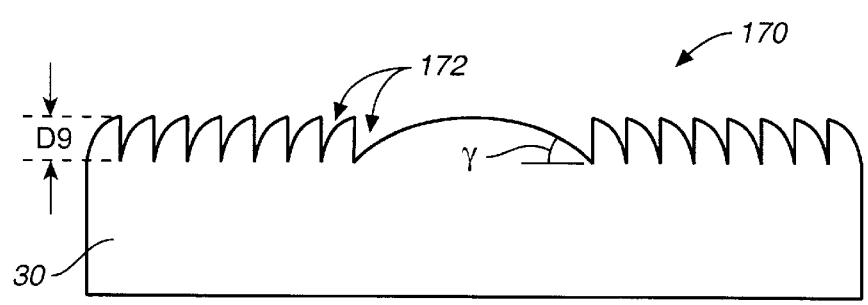
FIG._12
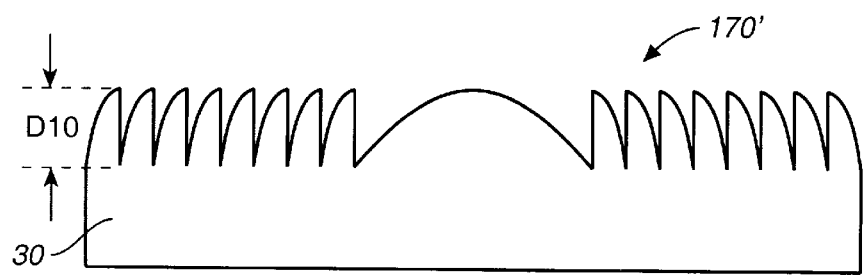
FIG._12'

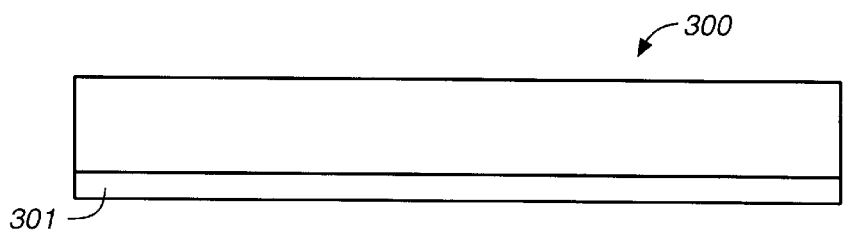
FIG._13A
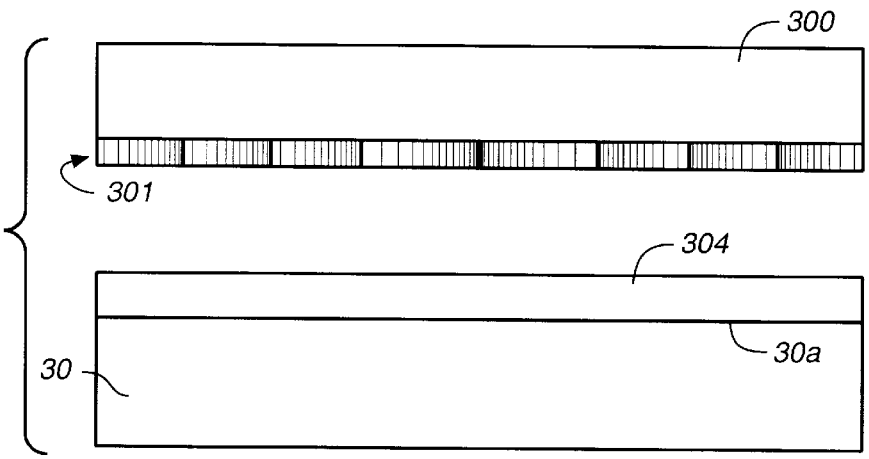
FIG._13B
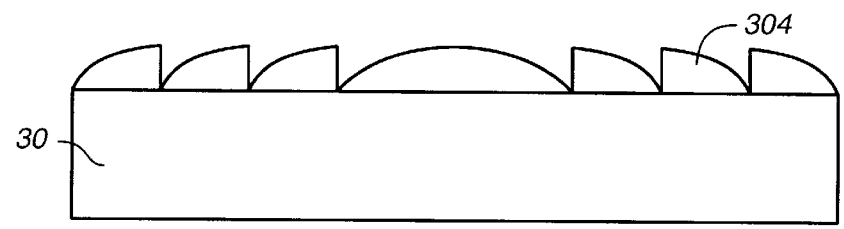
FIG._13C
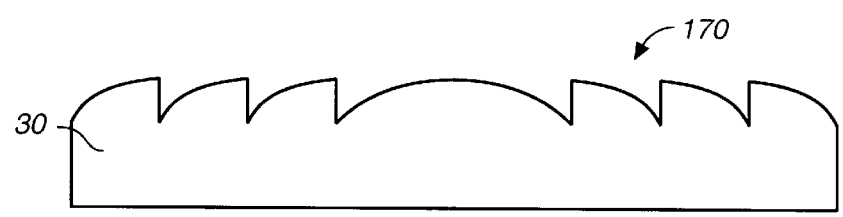
FIG._13D
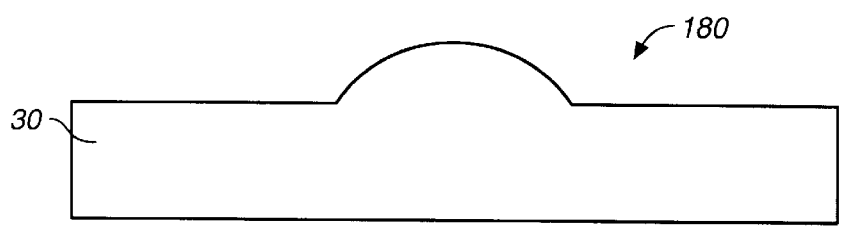
FIG._14

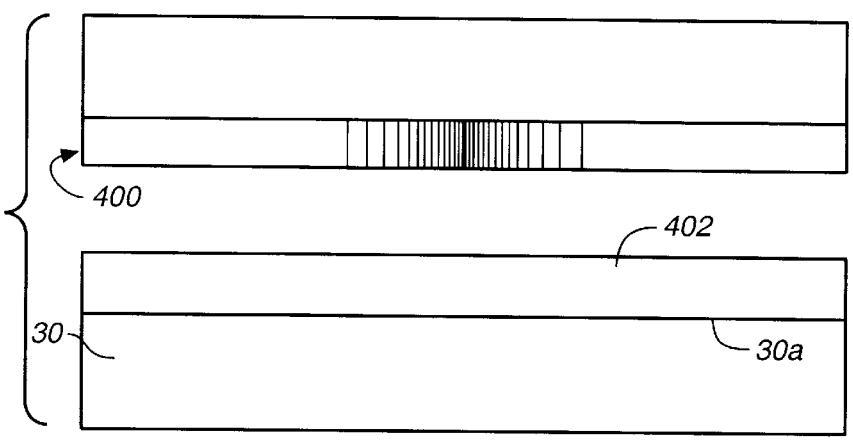
FIG._15A
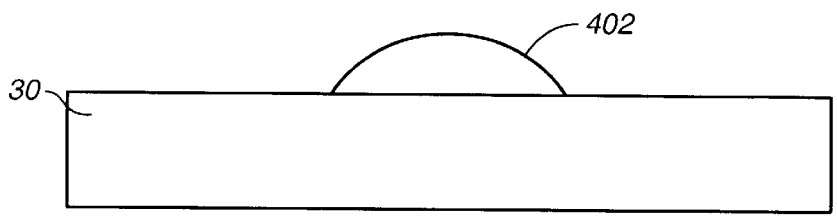
FIG._15B
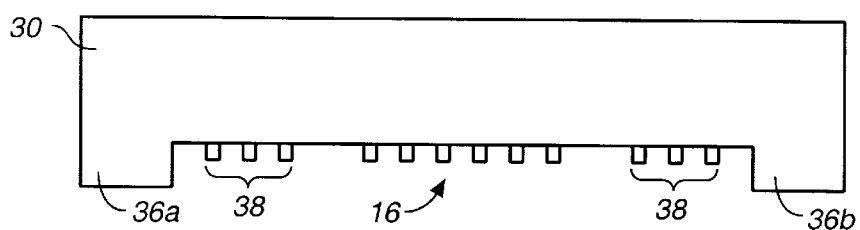
FIG._16
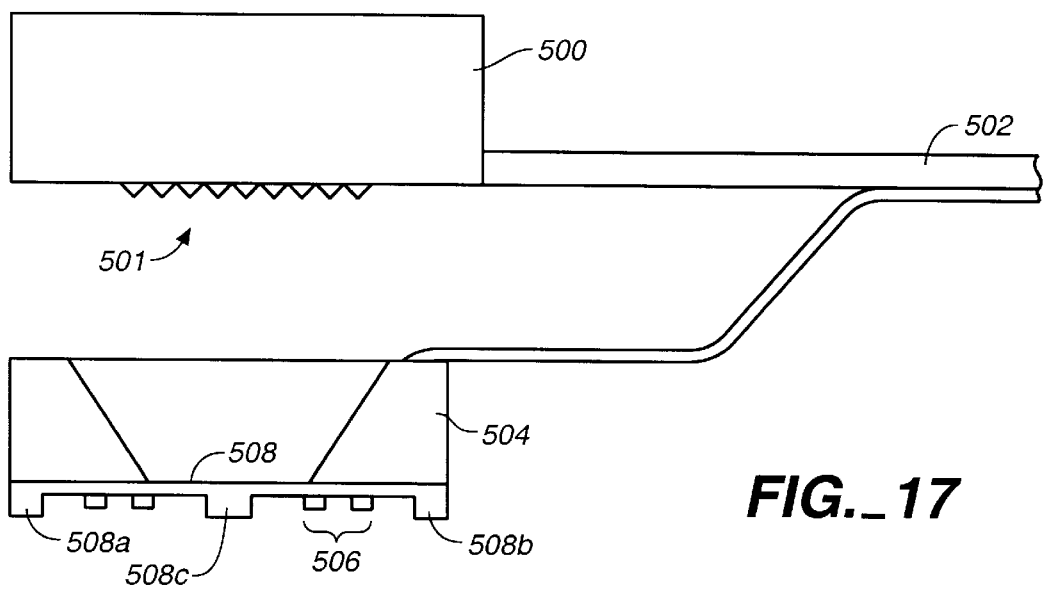
FIG._17

METHOD FOR MAKING AN OPTICAL OR MAGNETO-OPTIC HEAD AND THE RESULTING HEAD

CROSS-REFERENCE TO RELATED APPLICATIONS

This Application is a continuation in part of to U.S. patent application Ser. No. 08/833,608 file Apr. 11, 1997 and 08/857,324 file May 16, 1997, now U.S. Pat. No. 5,998,066, each of which is assigned to the assignee of the present Application.

BACKGROUND OF THE INVENTION

This invention relates to read-write heads used in magneto-optic and optical disk drives (e.g. CD read-only memories, CD read-write memories, and DVD media). This invention further relates to low cost high performance read-write heads.

Presently, magneto-optic and optical disk drives include a laser beam source which provides a laser beam that strikes the magneto-optic or optical disk. In the case of a magneto-optic disk, during writing operations, the laser beam and a magnetic field are simultaneously applied to the disk, and the presence of both the laser beam and magnetic field result in data being written to the disk.

In magneto-optic and optical disk drives, during read operations, a laser beam strikes the disk, and data is read by detecting light that reflects off the disk. In the case of a magneto-optic disk, depending upon the data recorded in the disk, the polarization of the laser light is altered by the magneto-optic layer within the disk. In the case of optical disks, different techniques can be used to record data in the disk. Some examples of optical and magneto-optic disks are discussed in European patent application EP 0 475 452 A2, incorporated herein by reference.

For both magneto-optic and optical disk drives, it is desirable to cause the laser beam to strike the disk at a very small spot to facilitate a high data recording density. It is an object of this invention to provide a structure which enables reading and/or writing data from or to a magneto-optic or optical disk which focuses a laser beam on a very small spot on the disk. It is also an object of this invention to provide such a structure in an inexpensive manner such that it can be mass-produced using wafer scale manufacturing techniques.

SUMMARY OF THE INVENTION

A method for manufacturing a magneto-optic or optical disk head comprises the step of simultaneously manufacturing many heads used for reading and/or writing data on a magneto-optic or optical disk. These heads are manufactured on a substrate simultaneously, in a manner which minimizes manufacturing costs. In one embodiment, the method comprises:

a) providing a substrate of transparent material such as glass;

b) lithographically forming a plurality of lenses on the top of the substrate simultaneously;

c) masking and etching the substrate to form a plurality of air bearing surface structures on the bottom surface of the substrate simultaneously; and d) cutting the substrate into individual heads.

In one embodiment, the lenses are diffractive optical lenses. The diffractive optical lenses can be formed by depositing an opaque material on the top surface of the substrate and lithographically patterning the opaque material to form diffraction patterns that serve as lenses for focusing light on magneto-optic or optical media. Of importance, many lenses can be formed on the substrate simultaneously and inexpensively in a pre-aligned manner.

In another embodiment, the lenses are phase zone plate lenses comprising bands of recessed regions formed in the transparent substrate. These bands of recessed regions can be formed by selectively etching portions of the transparent substrate. In one embodiment, the phase zone plates are "binary" refractive lenses. This means that the alternating bands of recessed regions are formed to the same depth. However, in other embodiments, the alternating bands are not all formed to the same depth.

In another embodiment, the lenses are blazed zone plate lenses.

In yet another embodiment, the lenses are refractive. A gray scale mask is used to etch the substrate so as to form curved, refractive lenses.

Also, in one embodiment, an electrical coil can be formed on each head on one side of the substrate to facilitate writing on magneto-optic recording media. The coils can be defined lithographically. Many coils can be formed simultaneously, thereby reducing manufacturing costs.

In an alternative embodiment, the heads are manufactured by:

a) forming a plurality of lenses on a first surface of a first transparent substrate;

b) depositing a transparent layer on a second substrate;

c) selectively etching the transparent layer to form air bearing surfaces (e.g. slider rails) from the transparent layer;

d) selectively etching portions of the second substrate so that portions of said second substrate are removed;

e) bonding said first and second substrates together;

f) defining optical wave guide structures in the transparent layer using optics formed on the first, transparent substrate in a self-aligning process;

g) forming electrical coils on the transparent layer; and h) cutting the bonded first and second substrates into individual read-write heads.

The second substrate can be either a transparent material or an opaque material such as silicon. The order in which the above processing steps are performed can be varied. For example, the coils can be formed on the transparent layer at various points in time during the process. Similarly, the lenses can be formed on the first substrate at various points in time during the process.

Of importance, many heads are formed simultaneously. It is not necessary to separately bond many lenses to many sliders as individual die or elements.

In another embodiment, instead of providing optical wave guide structures in the transparent layer using optics formed in the first transparent substrate, holes are etched in the transparent layer through which laser light passes during use.

BRIEF DESCRIPTION OF THE DRAWINGS

FIG. 1 schematically illustrates a magneto-optic disk drive.

FIG. 2A illustrates in cross section a subwavelength head that can be adapted to wafer scale production. (Subwavelength means that the diameter of the focal spot (meaning that the diameter of the circle defined by the points where light intensity is one half of the maximum intensity of the focal spot) is smaller than the wavelength of the light used with the lens.)

FIG. 2B illustrates in plan view the bottom of the head of FIG. 2A.

FIG. 2C illustrates in plan view the top of the head of FIG. 2A

FIG. 2D illustrates in plan view an alternate embodiment the bottom of a head in accordance with our invention.

FIGS. 3A–3E illustrate in cross section a head during a manufacturing process in accordance with our invention.

FIG. 4 illustrates in cross section a head constructed in accordance with a second embodiment of our invention.

FIG. 4' illustrates an embodiment of our invention in which a hole is formed in an oxynitride layer for light to pass through.

FIG. 4" illustrates an embodiment of our invention in which the slider rails are formed on a silicon substrate.

FIGS. 5A–5H illustrate the head of FIG. 4 during a manufacturing process in accordance with our invention.

FIG. 6 illustrates an Airy spot pattern created by a circular aperture.

FIG. 7 illustrates an optical structure including an axicon lens for optimizing the light intensity applied to a zone plate lens.

FIG. 8 illustrates an embodiment of a magneto-optic disk drive including an axicon lens 116 for enhancing the efficiency of a zone plate lens.

FIG. 9 illustrates two paths of light from a source passing through a zone plate lens to a focus point.

FIG. 10A illustrates in cross section a magneto-optic or optical head using a phase zone plate in accordance with another embodiment of our invention.

FIG. 10B illustrates in plan view the top of the phase zone plate of FIG. 10A.

FIGS. 11A to 11C illustrate in cross section a phase zone plate during a manufacturing method in accordance with our invention.

FIG. 12 illustrates in cross section a blazed zone plate lens in accordance with another embodiment of our invention.

FIG. 12' illustrates how one may increase the irradiance at the sub-primary focal length for a blazed phase zone plate by extending the length of a blazed region.

FIGS. 13A—13D illustrate a gray scale mask and a glass substrate in cross section during the manufacture of a blazed zone plate lens.

FIG. 14 illustrates an embodiment of our invention including a refractive lens.

FIGS. 15A and 15B illustrate in cross section a refractive lens during a manufacturing process in accordance with our invention.

FIG. 16 illustrates a magneto-optic head in which the lens is formed on the bottom of the head.

FIG. 17 illustrates an embodiment of our invention in which a lens is affixed to a first portion of a read/write arm suspension and a coil and wave guide are affixed to a second portion of the read/write arm suspension.

DETAILED DESCRIPTION

FIG. 1 illustrates a magneto-optic disk drive 10 including a laser source 12 for providing a beam 14 of laser light which reflects off a mirror 15 and passes through a diffractive lens 16 formed on a read-write head 18. After passing through lens 16, the laser light is focused onto a small spot on a magneto-optic disk 20. Laser light is passed through lens 16 to disk 20 during both reading and writing operations.

During use, disk 20 rotates at a high speed, e.g. about 3500 to 5000 rpm. Rotation of disk 20 causes an air cushion to form above the disk, and head 18 rides on this air cushion, thus "flying" a short distance (e.g. 2 to 15 micro-inches) above disk 20. The bottom 18a of head 18 includes an air bearing surface for riding on the air cushion. Also included on the bottom 18a of head 18 are coils 38 (not shown in FIG. 1, but shown in FIG. 2B) for producing a magnetic field. During writing operations, when laser light passes through lens 16, electrical current is passed through coils 38 to generate the magnetic field. The combination of a strong laser beam focused on a point on disk 20 and the magnetic field results in data being written on disk 20.

Head 18 is mounted on an arm 24, which is moved to desired positions over disk 20. The manner in which the position of arm 24 is controlled is conventional and will not be discussed further herein.

FIRST EMBODIMENT OF A READ-WRITE HEAD

FIGS. 2A, 2B and 2C illustrate head 18 in cross section, bottom plan view and top plan view, respectively. Head 18 is formed on a transparent substrate 30 (typically fused silica or glass). A zone plate diffraction pattern 32 is formed on a top surface 30a of substrate 30. Such diffraction patterns are described in U.S. patent application Ser. No. 08/833,608, incorporated herein by reference, and are discussed in greater detail below. Diffraction pattern 32 typically comprises opaque regions 34 separated by transparent regions 36 in an arrangement which serves as a diffractive lens for focusing laser light at a point 35. In this embodiment, diffraction pattern 32 serves as an "amplitude zone plate." The term "amplitude zone plate" refers to the fact that the amplitude of the light intensity emerging from the diffraction pattern varies with position, depending upon whether or not light is blocked by one of opaque regions 34. Opaque regions 34 are typically formed from a metal layer (e.g. Cr), deposited and lithographically patterned on substrate 30. (Although FIGS. 2A and 2C show only three opaque bands 34 and three transparent bands 36, typically there are many opaque and transparent bands in lens 32.)

Rails 36a, 36b extend downwardly from a bottom surface 30b of substrate 30 by a distance D1 (typically about 10 to 20 μm). Rails 36a, 36b serve as the air bearing surface of head 18. Also on the bottom surface 30b of substrate 30 are coils 38 for providing a magnetic field during write operations. Coils 38 are formed from a layer of Au, Cu, or other appropriate electrically conductive material, which is plated onto substrate 30 in a manner described below. Coils 38 are electrically contacted in a conventional manner (not shown).

Also extending from the bottom surface 30b of substrate 30 is a glass projection 40. In one embodiment, glass projection 40 merely provides a polished flat surface from which light emerges. In another embodiment, projection 40 is an optical waveguide which further processes the output light beam to decrease the effective diameter of the output light beam, and also increases the depth of focus of the lens. (Such an optical waveguide performs at the cost of some light attenuation, however.)

Head 18 typically has a width D2 of about 80 mils, a length D3 of about 140 mils and a thickness D4 of about 500 μm. The diameter D5 of diffractive pattern 32 is typically about 20 to 40 mils. However, these dimensions are merely illustrative, and head 18 could be other sizes as well.

METHOD OF MANUFACTURING THE FIRST EMBODIMENT

FIGS. 3A to 3E illustrate in cross section head 18 during manufacturing. Referring to FIG. 3A, a process for manufacturing head 18 begins by applying photoresist 50 to transparent substrate 30. In one embodiment, substrate 30 has a diameter of about 200 mm, but this is not critical. Photoresist 50 is then patterned, thereby exposing portions of substrate 30. The exposed portions of substrate 30 are then etched, e.g. to a depth of 10 to 20 µm by reactive ion etching, e.g. using $CHF_3$ as the etchant. In this manner, rails 36a, 36b and projection 40 are formed.

Photoresist 50 is then removed, and a plating base layer 52 comprising 15 nm thick Cr 52a and 100 nm thick Au 52b is sputtered onto the bottom surface of substrate 30 (FIG. 3B). A thick photoresist layer 54 is then spun onto the bottom of substrate 30 and then "soft-baked." (In one embodiment, photoresist 54 can be Shipley 5740 resist.) By "soft-baked," we mean heating the photoresist (preferably using a hot-plate) to remove a portion of a liquid solvent within the photoresist. Thereafter, photoresist 54 is patterned to expose regions 54a of plating base layer 52 (FIG. 3C). After exposure of photoresist 54, the photoresist is then subjected to a hard bake step. (This is another heat treatment step to remove more of the solvent from photoresist 54 to improve adhesion to plating base layer 52.) Gold 56 is then plated onto the exposed portion of plating base layer 52 to thereby form gold coils 38. In one embodiment, coils 38 have a thickness D6 of about 3 to 5 µm, a line width D7 of about 3 µm, and a line spacing D8 of about 2 µm. (These distances are merely exemplary. Other distances can be used.)

As mentioned above, although in one embodiment coils 38 are gold, coils 38 can be other electrically conductive materials, e.g. copper, and can be formed by methods other than plating, e.g. sputtering and selective etching.

Referring to FIG. 3D, photoresist 54 is removed, e.g. using a photoresist stripper. (Photoresist strippers are chemical mixtures typically specified by photoresist manufacturers for removing photoresist.) The portion of plating layer 52 underneath photoresist 54 is also removed, e.g. by blanket etching. (In one embodiment, plating layer 52 is removed using a KI/I solution for dissolving gold, and a cerric ammonium nitrate solution for dissolving chromium.) Plating base layer 52 is very thin compared to the thickness of coils 38. Thus, layer 52 can be removed with a blanket etching step without significantly etching coils 38.

The bottom of substrate 30 is then coated with a layer 58 of low stress silicon oxynitride using a conventional chemical vapor deposition (CVD) process. In one embodiment, layer 58 is about 1 µm or less thick.

A photoresist mask (not shown) is then formed on the bottom of substrate 30 and patterned to define electrical contact regions where coils 38 are to be contacted. Contact windows are then reactive ion etched in oxynitride layer 58, and this photoresist mask is then removed. Electrical contact structures are then formed by depositing another electrically conductive layer (e.g. sputtered Au, Cu or other conductive material) on the bottom of head 18 and lithographically patterning this conductive layer in a conventional manner.

Referring to FIG. 3E, diffractive lens 16 is then formed on substrate 30. Diffractive lens 16 is typically formed by depositing an opaque material such as Cr on top surface 30a of substrate 30 (e.g. by sputtering), and then patterning the Cr to form circular opaque bands 34. In this embodiment, because lens 16 is diffractive (as opposed to refractive), substrate 30 can be formed from normal glass or silica with a modest refractive index. (Substrate 30 can be formed from other transparent materials as well.) Therefore, substrate 30 can be a low cost material. Further details concerning the manner in which diffractive lens 16 is formed are discussed below.

While diffractive lens 16 is formed at the end of the above-mentioned process, in other embodiments, diffractive lens 16 can be formed at the beginning of the process. Also, diffractive lens 16 can be other types of diffractive lenses discussed below.

While FIGS. 3A to 3E show one head being formed, those skilled in the art will appreciate that the structure of FIGS. 3A to 3E also includes many other identical heads that are simultaneously formed elsewhere on substrate 30. Substrate 30 is then subjected to a cutting/dicing operation by which substrate 30 is cut into individual heads such as head 18. These heads are then mounted on an appropriate suspension assembly, such as arm 24 (see FIG. 1). Of importance, this manufacturing process does not require complex assembly procedures, e.g. in which individual lenses are mounted on individual sliders. The process is economical.

METHOD FOR MAKING DIFFRACTIVE LENS

The simplest form of diffractive lens 16 is typically a zone plate, and comprises a set of concentric opaque bands 34 on substrate 30. In one embodiment, lens 16 forms a diffraction limited sub-Airy sized spot. Sub-Airy sized diffraction spots are advantageous to the overall performance of the magneto-optic or optical disk drive as the sub-Airy sized spot increases the bit density of the magneto-optic disk because the area where the laser beam strikes the disk is smaller than the ordinary Airy spot.

An Airy spot is created by diffraction, typically by a circular aperture. The Airy spot is the central maximum corresponding to a high-irradiative circular spot, where the radius of the spot is calculated by the following equation using the conventional Rayleigh criterion:

$$\text{radius} = 0.61 \lambda / \text{N.A.} \tag{1}$$

where N.A. is the lens numerical aperture and λ is the wavelength of light. An example of an Airy pattern is shown in FIG. 6, where the vertical axis is a measure of irradiance and the horizontal axis is the distance from the center of the high central maximum. The Airy spot is represented by the high central maximum 124. Outside the Airy spot are a series of diffraction rings having decreasing amplitudes such as the first diffraction ring 126 and second diffraction ring 128.

Lens 16, in one embodiment, is a zone plate lens as shown in FIG. 2C. As mentioned above, zone plate lens 16 comprises a series of concentric alternating opaque and transparent regions 34, 36, respectively, which diffract and focus light into a small area. The zone plate performance is improved, i.e., the size of the spot produced by the lens is reduced below Airy size, by occluding (i.e., making opaque) a central area 37 of zone plate lens 16 as shown in FIG. 2C. The larger the occluded or opaque area 37, the smaller the radius of the central maximum of the diffraction pattern. With seventy to eighty percent of central area 37 of zone plate lens 16 occluded, the radius of the central maximum of the diffraction pattern will be decreased by approximately 30 to 40 percent. However, the amplitude of light of the other diffraction rings formed by the lens becomes larger, so a trade off is necessary depending on the application.

Because central area 37 is occluded, the light incident on zone plate lens 16 is preferably not uniform or the portion falling on the occluded central area 37 will be lost. In order to maximize the transfer of light power through zone plate lens 16, the incident light should be ring-shaped and matched to zone plate lens 16. An optic structure such as axicon lens 116 (FIG. 7) or a similar acting lens, creates an illuminated ring of light 120 on the real image plane when the entrance side 118 (object plane) is uniformly illuminated. The ring structure 120 may be matched to zone plate 16. An embodiment of head 18 is shown in FIG. 8 with a plane mirror 122, axicon lens 116, and lens 16. Head 18 is attached to suspension arm 24. The holder for plane mirror 122 and axicon lens 116 are not shown in FIG. 8 for clarity. The structures in FIG. 8 take incident plane parallel laser light and create a ring-shaped source to illuminate zone plate lens 16. Lens 16 then focuses the light into a sub-Airy diameter central maximum spot on disk 20.

As mentioned above, lens 16 comprises concentric regions of opaque material 34, such as chromium or a chromium alloy, deposited on transparent substrate 30. The chromium can be patterned using conventional lithographic techniques. Of course, other opaque materials may be also be used.

The radii of the zones in a zone plate may be calculated according to the grating equation. See, for example, Born and Wolf, "Principles of Optics: Electromagnetic Theory of Propagation Interference and Diffraction of Light," 6th edition, published by Pergamon Press in 1980, incorporated herein by reference. For low N.A. values, the following derivation illustrates the phenomenon.

FIG. 9 illustrates a light wave traveling from a source S through zone plate lens 16 to a focal point P. Two possible paths of the light wave are shown in FIG. 9. In one path, the light wave travels along segment $S_0$, from source S to the center 136 of lens 16, then travels along segment $P_0$ to focal point P. In the other path, the light wave travels along segment $S_m$, from the source S to the outer edge of the m'th zone $R_m$, then travels along segment $P_m$ to focal point P. Waves traveling these separate paths will arrive at focal point P $m\pi/2$ out of phase with each other, where m is the number of zones from the center. Accordingly:

$$(Sm+Pm)-(SO+PO)=m\lambda/2 \qquad (2)$$

where $\lambda$ is the wavelength of light. From inspection of FIG. 9, it can be seen that:

$$Sm=(SO^2+Rm^2)^{1/2};\ Pm=(PO^2+Rm^2)^{1/2} \qquad (3)$$

The expressions of equation 3 may be expanded using the binomial series. Assuming that $R_m$ is small compared to $S_0$ and $P_0$, only the first two terms need to be retained, which yields:

$$Sm=SO+(Rm^2/2SO);\ Pm=PO+(Rm^2/2PO) \qquad (4)$$

Substituting equation 4 into equation 2 yields the result:

$$(1/SO)+(1/PO)=m\lambda/Rm^2 \qquad (5)$$

If $S_0$ is large, equation 5 reduces to:

$$Rm^2=m\lambda PO \qquad (6)$$

The primary focal length f, the light wavelength $\lambda$ and the radius of the first zone $R_1$ are related:

$$f=R_1^2/\lambda \qquad (7)$$

As can be seen from equation 7, the focal length is adjustable. Further, a diffractive optic structure differs from a refractive optic structure in that the diffractive structure has multiple focal lengths, located for instance at distances f, f/3, f/5, f/7, the irradiance for a standard zone plate is considerably lessened at focal points closer than the primary focal point f, which is equal to $P_0$. However, the spot created at sub-primary focal lengths is also decreased in size.

Thus, the radius of the m'th zone $R_m$, where m is an integer m=1, 2, 3; is as follows:

$$Rm=R_1(m)^{1/2} \qquad (8)$$

The radius of the primary focal length spot size is approximately:

$$\text{radius}=0.59\lambda/\text{N.A.}\text{ (approximately }1.20\lambda f/D$$
$$\text{for small N.A. values)} \qquad (9)$$

where N.A. is the numeric aperture of the lens, $\lambda$ is the light wavelength, D is the diameter of the largest zone in the zone plate, i.e., $2R_{max}$, and f is the focal length of the lens. This primary spot size is an important parameter impacting the amount of data that can be stored per unit area on an magneto-optic or optical layer. The smaller the spot size, the more information that may be stored per unit area. As discussed above, the results may be improved by occluding center zone 37. Thus, the use of a zone plate may yield a very small spot size.

Instead of using photolithographic techniques to form lens 16, direct electron-beam ("e-beam") writing onto an e-beam resist layer may be used to pattern a mask for defining lens 16. In ordinary photolithographic techniques, there is a lower practical limitation of the printing resolution of approximately 0.25 $\mu$m. Direct e-beam writing allows much smaller geometric resolution to be achieved. The lower limit is about 20 nm or 0.02 $\mu$m. This is a significant improvement over photolithography.

Lens 16 can be designed to give high numerical apertures (i.e., N.A.) which will also decrease the diameter of the Airy spot by decreasing the focal length of the diffractive lens. The effective N.A. of a zone plate may be very high, such as 0.85 to 0.95. These high N.A.s are difficult to achieve with refractive optics, which are typically 0.4 to 0.5. The net result of a zone plate with an occluded center and a high effective N.A. is to create a small spot with a size equivalent to that produced by a refractive lens with a very high index of refraction and high N.A.

The above detailed properties can be modified to suit specific applications, but the advantages of small spot size (i.e., high data storage density) and adjustable focal lengths (i.e., no fly height limitations) still remain.

SUPER-RESOLUTION EMBODIMENT

In one embodiment, the zone plate can be modified to provide a smaller spot size using super resolving techniques. Typically, this involves rendering opaque not only the central spot in the zone plate lens, but rendering opaque regions which would otherwise constitute the inner bands of the zone plate. The advantage of doing this is that the spot size will be smaller. The disadvantage of doing this is that less light will pass through the lens. Nonetheless, in some embodiments, this trade-off is advantageous. (The larger the amount of occluded central bands, the smaller the spot size. One can also partially occlude the central bands to obtain some of this effect.) The mathematics governing super resolving lenses is discussed, for example, by Cox, et al., "Reappraisal of Arrays of Concentric Annuli as Superresolving Filters," JOSA Letters, Vol. 72, No. 9, Sept. 1982, page 1287, and Toraldo Di Francia, "Nuove Pupille Superrisolventi," Atti. Fond. Giorgio Ronchi 7, page 336–372, published in 1952. Cox and Francia are incorporated herein by reference.

ALTERNATE EMBODIMENT OF AIR BEARING SURFACE SLIDER RAILS

FIG. 2D illustrates in plan view a modified version of the bottom of a head in accordance with our invention including rails 36a' and 36b', and coils 40'. The leading edge of rails 36a', 36b' include an inclined region 41 which slopes upward at a slight angle. Inclined region 41 can be mechanically formed on rails 36a', 36b'. As can be seen, rails 36a', 36b' do not extend the entire distance to the trailing edge of head 18'.

It will be appreciated that the shape of the air bearing structures of head 18' can be modified as desired to achieve desired aerodynamic effects.

PHASE ZONE PLATE EMBODIMENT

In another embodiment, instead of using an amplitude zone plate as lens 16, a phase zone plate 150, as shown in FIGS. 10A and 10B, is used. Similar to amplitude zone plate lens 16, phase zone plate 150 comprises a series of concentric rings 152. However, rings 152 of phase zone plate 150 are all transparent, with alternating rings 154 recessed a depth D9 into glass substrate 30 with a refractive index of n. Thus, because phase zone plate 150 has no opaque zones, it can provide more light at the focal spot than amplitude zone plate lens 16. FIG. 10A shows a cross section view of phase zone plate 150 with alternating rings 154 recessed. The recessed rings 154 induce a phase shift of $\pi$ radians. The depth D9 of the recess is found by the following formula:

$$D9=\lambda/(2(n-1)) \tag{10}$$

While FIGS. 10A and 10B show that rings 154 are all recessed to the same depth D9, in other embodiments, different ones of rings 154 extend to different depths.

METHOD OF MAKING ZONE PLATE LENS

FIGS. 11A to 11C illustrate in cross section a phase zone plate during a manufacturing process in accordance with our invention. Referring to FIG. 11A, substrate 30 is covered with a Cr layer 200 (about 30 nm thick). A photoresist layer 204 is then deposited on substrate 30 and then patterned to expose portions of layer 200. The exposed portions of Cr layer 200 thereunder are then dissolved by known wet etchants (e.g. cerric ammonium nitrate), thereby exposing portions of substrate 30. The remaining portions of Cr layer 200 are used as a mask during a subsequent etching process.

Referring to FIG. 11B, photoresist 204 is then removed, and the exposed portions of substrate 30 are subjected to a HF etching solution, thereby forming a phase zone plate lens 150. (In other embodiments, other etching techniques can be used to etch substrate 30.)

Referring to FIG. 11C, the remaining portions of Cr layer 200 are then removed, thereby leaving phase zone plate 150.

While only one phase zone plate is shown in FIGS. 11A to 11C, it will be appreciated that numerous phase zone plates are formed elsewhere on substrate 30. Also, although only a few bands are shown in FIGS. 10 and 11, typically zone plate 150 includes many bands. It is also noted that FIGS. 11A to 11C do not illustrate the process by which rails 36a, 36b, coils 38 and projection 40 are formed. These structures are formed in the same manner as discussed above with respect to FIGS. 3A to 3E. They may be formed either before or after bands 154 are formed.

BLAZED ZONE PLATE EMBODIMENT

In another embodiment the phase zone plate is modified by blazing. FIG. 12 shows in cross section substrate 30 with a blazed phase zone plate lens 170. Similar to phase zone plate 150, blazed phase zone plate 170 consists of concentric rings, with alternating rings 172 recessed into substrate 30. In another embodiment, the recessed rings 172 induce a phase shift of $m\pi$ radians (where m is an integer) as follows:

$$D10=m\lambda/2(n-1) \tag{11}$$

(FIG. 12' indicates that distance D10 is the vertical height of the recesses.) Such calculations are carried out by known means. Details concerning diffraction phenomena relating to zone plates, phase zone plates and blazed phase zone plates are described in "Optics," by E. Hecht, Addison-Wesley Publishing Co., 1987, 2nd ed, which is herein incorporated by reference; "Introduction to Modem Optics," by G. Fowles, Dover Publications, Ind., 1975, 2nd ed, which is herein incorporated by reference; and "Introduction to Classical and Modem Optics," by J. Meyer-Arendt, Prentice-Hall, Inc., 1972, which is herein incorporated by reference.

In one embodiment, neither the phase zone plate or blazed zone plate embodiments have an occluded zone, and the light incident on the phase zone plate and the blazed phase zone plate may be uniform. Thus, axicon lens 116 used with the amplitude zone plate embodiment of FIGS. 7 and 8 to create an incident ring of light is unnecessary. However, in an alternate embodiment, the central portion of the phase zone plate or blazed zone plate is rendered opaque to further decrease the spot size to make it a sub-Airy spot size. (This can be done by depositing opaque material such as Cr on substrate 30 and patterning the opaque material by appropriate masking and etching.)

Although FIGS. 12 and 12' show only a few blazed bands, typically lens 170 includes many blazed bands.

In the phase zone, phase zone plate and blazed phase zone plate embodiments, the diffractive optic structure may be either on the bottom surface or the top surface of substrate 30, e.g. as shown in FIG. 16.

METHOD OF MAKING BLAZED PHASE ZONE PLATE LENS

A blazed phase zone plate may be created by etching steps approximating the slope of the blazed surface. This is accomplished by using four to eight masks, and etching increasing depths to approximate the slope of the blazed surface. Another approach is to create a gray scale mask in a substrate such as a high energy beam sensitive glass (HEBS) as described in U.S. Pat. No. 5,078,771, issued to C. Wu on Jan. 7, 1992, which is herein incorporated by reference; and is described in the paper entitled "Cost Effective Mass Fabrication of Multilevel Diffractive Optical Elements Using a Single Optical Exposure with a Gray-Scale Mask on High Energy Beam Sensitive Glass," by Walter Daschner, et al., from University of California San Diego, Nov./Dec. Journal of American Vacuum Society, 1996, which is herein incorporated by reference; and the publication "HEBS-Glass Photomask Blanks," from Canyon Materials, Inc., CMI Product Information No. 96-01, which is herein incorporated by reference. A glass substrate 300 is diffused with silver to a depth of 3–4 $\mu$m in layer 301, as shown in FIG. 13A. Glass substrate 300 is doped with a photo inhibitor to make substrate 300 inert to ultra-violet light or light of shorter wavelengths, but reactant to high energy beams, e.g., an e-beam greater than 10 kv. The blazed phase zone plate mask is directly written on substrate 300 with an e-beam as a function of gray scale. In this manner a gray scale mask is generated as shown in FIG. 13B. A thick layer of resist 304, such as Shipley S1650, is spun over substrate 30 to a thickness of approximately 6 μm, as shown in FIG. 13B. The gray scale mask is used to expose the thick resist layer 304 over surface 30a of substrate 30 as shown in FIG. 13C. In this manner the gray scale from substrate 300 is transferred to a vertical dimension in resist 304 as shown in FIG. 13C. Substrate 30 is then etched using, for example, chemically assisted ion beam etching ("CAIBE"), which etches through the resist and into the substrate. The CAIBE etches into substrate 30 a representation of the gray scale mask 300, leaving a blazed phase zone plate 170 in substrate 30 as shown in FIG. 13D.

In another embodiment, the blazed zone plate can be formed using the method described in U.S. patent application Ser. No. 08/857,324, filed May 16, 1997, incorporated herein by reference.

As mentioned above, although only one blazed zone plate is shown in FIGS. 13A to 13D, typically many blazed zone plates are formed elsewhere on substrate 30. Also, although FIGS. 13A to 13D do not show rails 36a, 36b, coils 38 and glass projection 40, these structures are also formed, either before or after the blazed zone plates are formed. Rails 36a, 36b, coils 38 and projection 40 are manufactured as described above with respect to FIGS. 3A to 3E.

EMBODIMENT WITH A REFRACTIVE LENS

In another embodiment, instead of forming a diffractive lens, a refractive lens is formed. FIG. 14 illustrates an embodiment of our invention using a refractive lens 180 instead of a diffractive lens. Lens 180 is typically formed using a gray scale mask in a manner similar to the blazed zone plate. Specifically, as shown in FIG. 15A, a gray scale mask 400 is formed, and a thick photoresist layer 402 is deposited on surface 30a of substrate 30. Photoresist 402 is exposed through mask 400 as shown in FIG. 15B. Resist 402 and substrate 30 are then etched in a manner similar to that described above concerning the blazed zone plate.

EMBODIMENT OF A READ-WRITE HEAD MANUFACTURED WITH TWO SUBSTRATES

FIG. 4 illustrates in cross section a head 100 constructed in accordance with another embodiment of our invention, comprising a lens 102 formed on a glass substrate 101, a silicon spacer 104, and a transparent layer 106 (typically silicon oxynitride). Oxynitride layer 106 includes extension regions 106a, 106b which serve as rails for head 100. Also included is an extension region 106c which serves as a wave guide. Region 106c typically has a length D10 equal to about 5λ to 30λ, where λ is the wavelength of light used in conjunction with head 100. In one embodiment, head 100 is used in conjunction with laser light having a wavelength of approximately 650 nm, the bottom end of region 106c has diameter less than 0.5 μm, and region 106c has a length of about 10 to 15 μm. Of importance, region 106c serves as a waveguide for increasing the amount of light that reaches the focal spot and decreases the spot diameter. Region 106c also serves as an optical flat exit surface for light emerging from the lens. The light emerging from wave guide 106c has a relatively long depth of focus compared to its width.

Also included on the bottom surface of head 100 are coils 108 for generating a magnetic field.

Lens 102 is a diffractive lens formed on the bottom of glass 101. Glass 101 typically has a thickness D11 of about 500 μm. Similarly, silicon spacer 104 has a thickness D12 of about 500 μm. Glass 101 and silicon spacer 104 are typically bonded together using an anodic bonding process described below.

METHOD OF MAKING A READ-WRITE HEAD WITH TWO SUBSTRATES

FIGS. 5A to 5H show head 100 during a manufacturing process in accordance with our invention. During this manufacturing process, lens 102 is formed on a transparent substrate 101. As shown in FIG. 5A, lens 102 comprises opaque bands 103 which form a diffractive lens. However, in other embodiments, lens 102 can be a phase zone plate, a blazed zone plate or a refractive lens as discussed above. These lenses can be formed either on the top or bottom surface of substrate 101.

Referring to FIG. 5B, a silicon wafer 150 is covered with low stress silicon oxynitride layer 106, e.g. to a thickness of 25 μm, e.g. by chemical vapor deposition. Thereafter, a photoresist layer 154 is deposited on layer 106 and patterned to define air bearing surface rails 106a and 106b and wave guide region 106c. The exposed portions of layer 106 are then etched such that 15 μm of the oxynitride layer is removed from the exposed portions, and 10 μm of oxynitride layer 106 remains. The thickness of the oxynitride layer at rails 106a and 106b and wave guide region 106c is 25 μm. Photoresist layer 154 is then removed.

Referring to FIG. 5C, the top surface 150a of wafer 150 is covered with a Cr/Au mask layer 156 by sputtering. Layer 156 is then lithographically patterned to define a cavity region 156a. The exposed portion of wafer 150 is then removed, e.g. with an alkaline etchant such as KOH or quaternary ammonium hydroxide. In one embodiment wafer 150 is 100 silicon, and mask layer 156 is aligned in the 110 direction of the wafer. (The numbers 100 and 110 are well-known crystallographic indices.) KOH etches silicon preferentially along certain crystal axes, thereby forming a characteristic angle α of about 54°. Cr/Au layer 156 is then removed by appropriate etchants, e.g. a KI/I solution for etching gold and a cerric ammonium nitrate solution for etching chromium. At the conclusion of this step, the remaining portion of wafer 150 will serve as spacer layer 104.

Referring to FIG. 5D, coils 108 are then formed on the bottom of oxynitride layer 106. This is done in the same manner as discussed above in relation to FIGS. 3A to 3E. In other words, a) a Cr/Au plating base layer is sputtered onto oxynitride layer 106, b) a stencil photoresist mask is deposited and patterned over the plating base layer to define where coils are to be plated, c) coils are plated onto the exposed portions of the base layer, d) the photoresist is removed, thereby exposing the remainder of the Cr/Au plating base, and e) the exposed portion of the Cr/Au plating base is removed.

Referring to FIG. 5E, Silicon spacer 104 is then bonded to glass 101 with an anodic bonding process. This bonding process is similar to the FAT bonding process described in U.S. Pat. No. 4,680,243, issued to Shimkunas et al., incorporated herein by reference. During this process, a voltage between about several hundred volts and 1500 volts is applied to silicon spacer 104 relative to glass 101, and the glass and silicon spacer are placed in a vacuum and heated from about 250 to 325° C. this results in the formation of a very strong bond between the glass and silicon. This bond includes an adhesion zone thickness on the order of 10 atomic diameters (e.g. about 2 nm). (In other embodiments, other bonding techniques can be used.)

Referring to FIG. 5F, a first photoresist layer 160 is then deposited and patterned to expose a portion of oxynitride structure 106c. A second photoresist layer 162 is then deposited and patterned to form oxynitride structure 106c into a waveguide in a novel manner. Specifically, a beam 163 of light (typically UV light) is applied through lens 102. A portion of lens 102 (typically the outer portion of the lens) focuses the UV light onto a small portion 162a of photoresist layer 162. The unexposed portions of photoresist layer 162 are then removed, as shown in FIG. 5G. Because of the manner in which photoresist layer 162 is exposed, this portion of the process of the present invention is a self-aligned process, ensuring that the position of portion 162a is formed in a precisely controlled position relative to lens 102.

In one embodiment, lens 102 is to be used in conjunction with a laser having a different wavelength than beam 163 of UV light. In such an embodiment, some of opaque bands 103 are part of a UV light diffractive lens for use during the step of patterning photoresist 162, and other ones of opaque bands 103 are part of the lens that is used in conjunction with a magneto-optic or optical disk drive.

Referring to FIG. 5H, the exposed portions of oxynitride structure 106c are then etched by reactive ion etching, thereby forming structure 106c into a waveguide.

Although only one head is shown in FIGS. 5A to 5H, typically, many heads are formed simultaneously from substrate 101 and silicon 150. Substrate 101 and spacer 104 are then cut into individual heads.

In an alternate embodiment, instead of forming waveguide structure 106c, a hole 106c' is selectively etched in a central portion of layer 106 (see FIG. 4'). Thus, the light passes through hole 106c' without being refracted, diffracted, or otherwise altered by oxynitride layer 106. In this embodiment, it does not matter whether layer 106 is transparent or not.

In yet another alternate embodiment, instead of forming rails 106a, 106b in oxynitride layer 106, rails 104a, 104b are formed in silicon wafer 104 (see FIG. 4".) In this embodiment, wafer 104 is covered with a photomask. The photomask is then patterned to define slider rails 104a, 104b. Wafer 104 is then subjected to a reactive ion etching process (e.g. using Surface Technology Systems silicon reactive ion etching apparatus or Alcatel silicon reactive ion etching apparatus) to remove 10 to 20 μm of silicon on the silicon wafer 104 except those portions covered by the photomask. The process of forming rails 104a, 104b can be performed at any convenient point in the manufacturing process, e.g. before or after the central hole is etched in wafer 150.

EMBODIMENT USING SEPARATE SUSPENSION STRUCTURES

Referring to FIG. 17, another embodiment of our invention includes a glass substrate 500 carrying a diffractive lens 501 is affixed to arm 502. A second substrate 504 carrying coil 506 and silicon oxynitride layer 508 is also affixed to arm 502. Layer 508 carries coil 506 for generating a magnetic field during writing operations. Layer 506 also includes thick portions 508a, 508b which serve as air bearing rails, and portion 508c which serves as a wave guide. The embodiment of FIG. 17 is essentially the same as FIG. 4, except that the silicon spacer layer is not directly affixed to the glass lens.

While the invention has been described with respect to specific embodiments, those skilled in the art will recognize that changes can be made in form and detail without departing from the spirit and scope of the invention. For example, in the embodiment of FIGS. 3A to 3E, mesa 40 can be formed into a waveguide in accordance with a self-aligned process in a manner similar to the embodiment of FIGS. 5A to 5H. Instead of glass, other transparent materials may be used. In addition, the coils can be constructed from other appropriate electrically conductive materials. Other materials and dimensions can be used in lieu of the materials and dimensions disclosed herein. Also, instead of a rail-shaped air bearing surface, other shaped air bearing surfaces can be formed. Accordingly, all such changes come within our invention.

We claim:

1. A method for manufacturing heads for use in magneto-optic or optical drives comprising the steps of:
   providing a transparent substrate;
   forming a plurality of lenses on said substrate;
   forming a plurality of air bearing surface structures on said substrate; and
   separating said substrate into a plurality of heads,
   wherein the lenses are refractive lenses, said method comprising the step of depositing a mask on said substrate, patterning said mask to define the shape of said refractive lenses, and transferring the shape of said mask to said substrate to form said refractive lenses in said substrate.

2. A method for manufacturing heads for use in magneto-optic or optical drives comprising the steps of:
   providing a transparent substrate;
   forming a plurality of lenses on said substrate;
   forming a plurality of air bearing surface structures on said substrate;
   forming a plurality of mesas on a side of said substrate opposite said lenses; and
   separating said substrate into a plurality of heads.

3. A method for manufacturing heads for use in magneto-optic or optical drives comprising the steps of:
   providing a transparent substrate;
   forming a plurality of lenses on said substrate;
   forming a plurality of air bearing surface structures on said substrate; and
   separating said substrate into a plurality of heads,
   said method further comprising forming a plurality of coils on one side of said transparent substrate by:
   depositing a plating base layer on said substrate;
   forming a stencil mask on said plating base layer, said stencil mask exposing portions of said plating base layer; and
   plating electrically conductive material onto the exposed portions of said plating base layer to thereby form said coils.

4. Method of claim 3 wherein said air bearing surface structures are rails for supporting said heads during use.

5. Method of claim 3 wherein said lenses are diffractive lenses formed by depositing an opaque layer on said substrate and patterning said opaque layer to form diffraction patterns which serve as said lenses.

6. Method of claim 3 wherein said lenses are phase zone plate lenses formed by forming a mask on said substrate, patterning said mask to expose portions of said substrate, and etching said exposed portions of said substrate to form recess regions which serve as said lenses.

7. Method of claim 3 wherein said lenses are blazed zone plate lenses.

8. Method of claim 3 wherein said lenses are formed on a first side of said substrate and said air bearing surface structures are formed on a second side of said substrate.

9. Method of claim 3 further comprising the step of removing said stencil mask and any portions of said plating base layer thereunder.

10. Method of claim 9 further comprising the steps of:

forming an insulating layer over the coils;

forming electrical contact windows in the insulating layer;

depositing a conductive layer on the insulating layer and the electrical contact windows for electrically contacting the coils; and patterning the conductive layer to form electrical leads.

11. A method for manufacturing heads for use with magneto-optic or optical media, said method comprising:

forming a plurality of lenses on a first transparent substrate;

forming a transparent layer on a second substrate;

removing a plurality of portions of said second substrate, thereby exposing portions of said transparent layer; and bonding said first and second substrates together.

12. Method of claim 11 further comprising the step of forming air bearing surface structures on said transparent layer.

13. Method of claim 12 further comprising the step of forming electrically conductive coils on the transparent layer.

14. Method of claim 11 further comprising the step of forming wave guide structures in said transparent layer, said wave guide structures being defined by said lenses.

15. Method for manufacturing heads for use with magneto-optical or optical media comprising:

forming a plurality of lenses on a first transparent substrate;

forming a layer of material on a second substrate;

forming a plurality of coils on said layer of material;

removing a portion of said second substrate;

bonding said first substrate and the remaining portion of said second substrate together; and separating said first and second substrates into heads.

16. Method of claim 15 further comprising the step of forming a hole in said layer of material so that light can pass therethrough.

17. Method comprising:

providing a plurality of diffractive lens on a first side of a substrate;

providing a plurality of raised transparent regions on a second side of said substrate; and separating said substrate into a plurality of pieces, each piece comprising a diffractive lens and a raised transparent region such that light passing through said diffractive lens can emerge from said raised transparent region.

18. Method of claim 17 wherein said raised transparent regions serve as wave guides.

19. Method of claim 17 wherein said providing of said raised transparent regions comprises:

providing a mask on said second side of said substrate;

patterning said mask so that said mask covers a first set of portions of said second side of said substrate but leaves a second set of portions of said second side exposed; and etching said second set of portions of said second side of said substrate, thereby leaving said raised transparent regions at said first portions.

20. Method of claim 19 wherein said raised transparent regions provide a flat surface from which light emerges after passing through said lenses.

21. Method of claim 19 further comprising providing a set of air bearing surfaces on said second side of said substrate during said providing of said raised transparent regions.

22. Method of claim 17 wherein said diffractive lenses are blazed zone plate lenses, said providing of said plurality of diffractive lenses comprising:

covering said first side of said substrate with a layer of resist;

patterning said layer of resist so that said resist has the shape of said blazed zone plate lenses; and transferring the pattern in said resist to said substrate.

23. Method of claim 17 wherein said diffractive lenses are phase zone plate lenses.

24. Method of claim 17 wherein said diffractive lenses are amplitude zone plate lenses.

25. Method of claim 17 further comprising forming air bearings on said second side of said substrate.

26. Method of claim 17 further comprising mounting said plurality of pieces within data disk drives, each data disk drive comprising a data recording medium, each diffractive lens focusing light on said data recording medium.

27. Method for manufacturing a lens comprising the steps:

forming a plurality of diffractive lenses on a transparent substrate;

forming a plurality of electrically conductive coils on said substrate for generating a magnetic field; and separating said substrate into a plurality of pieces, each piece comprising a diffractive lens for focusing light and an electrically conductive coil for generating a magnetic field.

28. Method of claim 27 wherein said forming of said plurality of said electrically conductive coils comprises:

forming a plating base on said substrate;

forming a mask on said plating base, said mask having openings defining where said coils are to be formed, said openings exposing portions of said plating base; and plating said coils onto the exposed portions of said plating base.

29. Method of claim 27 further comprising the step of forming a set of air bearing surfaces on said substrate.

30. Method of claim 27 further comprising mounting said plurality of pieces within data disk drives, each data disk drive comprising a data recording medium, each diffractive lens focusing light on said data recording medium.

31. Method for making a lens for use in a data storage drive comprising:

depositing a layer of resist on a transparent substrate;

patterning said resist so that said resist has the shape of a blazed zone plate lens;

transferring the pattern in said resist to said transparent substrate so that said transparent substrate comprises a blazed zone plate lens; and mounting said lens so that said lens focuses light onto a data storage medium, wherein a plurality of lenses are formed on said substrate simultaneously, said method further comprising separating said substrate into pieces, each piece comprising a blazed zone plate lens, and mounting each piece within a data storage drive.

32. Method of claim 31 wherein said patterning comprises directly writing a pattern into said resist.

33. Method of claim 32 wherein said directly writing comprises using an e-beam to directly write.

34. Method of claim 32 wherein said directly writing comprises writing a gray scale pattern into said resist.

35. Method of claim 31 further comprising the step of exposing said resist through a gray scale mask to thereby define said pattern in said resist.

36. Method for making a lens for use in a data storage drive comprising:

depositing a layer of resist on a transparent substrate;

patterning said resist so that said resist has the shape of a blazed zone plate lens;

transferring the pattern in said resist to said transparent substrate so that said transparent substrate comprises a blazed zone plate lens; and forming coils on said substrate to generate a magnetic field.

37. Method of claim 36 further comprising mounting said lens within a data disk drive, said data disk drive comprising a magneto-optic data recording medium, said diffractive lens focusing light on said data recording medium.

38. Method of claim 36 further comprising:

forming a plurality of blazed zone lenses on said substrate simultaneously;

forming a plurality of coils on said substrate simultaneously; and separating said substrate into a plurality of pieces, each piece comprising a blazed zone plate lens and a coil.

* * * * *